(12) United States Patent
Abdulaziz et al.

(10) Patent No.: US 12,267,081 B2
(45) Date of Patent: Apr. 1, 2025

(54) APPARATUS FOR DIGITAL REPRESENTATION OF ANGULAR DIFFERENCE

(71) Applicant: Telefonaktiebolaget LM Ericsson (publ), Stockholm (SE)

(72) Inventors: Mohammed Abdulaziz, Lund (SE); Henrik Sjöland, Lund (SE); Tony Påhlsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 41 days.

(21) Appl. No.: 18/256,059

(22) PCT Filed: Dec. 14, 2020

(86) PCT No.: PCT/EP2020/085909
§ 371 (c)(1),
(2) Date: Jun. 6, 2023

(87) PCT Pub. No.: WO2022/128049
PCT Pub. Date: Jun. 23, 2022

(65) Prior Publication Data
US 2024/0039543 A1 Feb. 1, 2024

(51) Int. Cl.
*H03L 7/095* (2006.01)
*H03L 7/087* (2006.01)

(52) U.S. Cl.
CPC .............. *H03L 7/095* (2013.01); *H03L 7/087* (2013.01); *H03L 2207/50* (2013.01)

(58) Field of Classification Search
CPC ..... H03L 2207/50; H03L 7/085; H03L 7/087; H03L 7/097; H03L 7/091
See application file for complete search history.

(56) References Cited

U.S. PATENT DOCUMENTS 8,248,106 B1 8/2012 Cohen et al.
9,490,831 B2 11/2016 Kim et al.
(Continued)

FOREIGN PATENT DOCUMENTS

| GB | 2545752 A | 6/2017 |
|---|---|---|
| WO | 2017160947 A1 | 9/2017 |
| WO | 2021185430 A1 | 9/2021 |

OTHER PUBLICATIONS

Iizuka, Tetsuya, et al., "A Fine-Resolution Pulse-Shrinking Time-to-Digital Converter with Completion Detection utilizing Built-In Offset Pulse", IEEE Asian Solid-State Circuits Conference, Toyama, Japan, Nov. 7-9, 2016, 1-4.
(Continued)

*Primary Examiner* — Diana J. Cheng
(74) *Attorney, Agent, or Firm* — Murphy, Bilak & Homiller, PLLC

(57) ABSTRACT

An apparatus is disclosed for provision of an indication of an angular difference between first and second input signals. The apparatus comprises a phase frequency detector (PFD) configured to receive the first and second input signals and to provide first and second outputs based on the first and second input signals. A difference in pulse length between signals provided at the first and second outputs is indicative of the phase difference between the first and second input signals. The apparatus also comprises first and second time-to-digital converters (TDCs) each configured to receive one of the signals provided by the PFD and to provide a corresponding digital pulse length representation. Each of the TDCs is a pulse length modifying TDC, wherein pulse length modification may comprise pulse length shrinking or pulse length extension. The apparatus also comprises a comparator configured to provide the indication of the phase difference based on the digital pulse length representations
(Continued)

provided by the first and second TDCs. Corresponding digital phase-locked loop (DPLL) and communication device are also disclosed.

27 Claims, 5 Drawing Sheets

(56) References Cited

U.S. PATENT DOCUMENTS 10,193,561 B2 * 1/2019 Lesso ............... H03L 7/181
2006/0171495 A1 8/2006 Youssouflan

OTHER PUBLICATIONS

Liu, Yue, et al., "Multi-stage Pulse Shrinking Time-to-Digital Converter for Time Interval Measurements", Proceedings of the 10th European Conference on Wireless Technology, Munich, Germany, Oct. 2007, 347-350.

Lu, Ping, et al., "A 3.6 mW, 90 nm CMOS Gated-Vernier Time-to-Digital Converter With an Equivalent Resolution of 3.2 ps", IEEE Journal of Solid-State Circuits, vol. 47, No. 7, Jul. 2012, 1626-1635.

Lu, Ping, et al., "A 5GHz 90-nm CMOS All Digital Phase-Locked Loop", IEEE Asian Solid-State Circuits Conference, Taipei, Taiwan, Nov. 16-18, 2009, 1-4.

Räisänen-Ruotsalainen, Elvi, et al., "A low-power CMOS time-to-digital converter", IEEE Journal of Solid-State Circuits, vol. 30, No. 9, Sep. 1995, 984-990.

Straayer, Matthew Z., et al., "A Multi-Path Gated Ring Oscillator TDC With First-Order Noise Shaping", IEEE Journal of Solid-State Circuits, vol. 44, No. 4, Apr. 2009, 1089-1098.

Vollenbruch, Ulrich, et al., "Requirements for Time-to-Digital Converters in the context of digital-PLL based Frequency Synthesis and GSM Modulation", 2006 IEEE MTT-S International Microwave Symposium Digest, San Francisco, CA, 2006, 1817-1820.

Wu, Ying, et al., "A 3.5-6.8-GHz Wide-Bandwidth DTC-Assisted Fractional-N All-Digital PLL With a Mash Δ-TDC for Low In-Band Phase Noise", IEEE Journal of Solid-State Circuits, vol. 52, No. 7, Jul. 2017, 1885-1903.

* cited by examiner

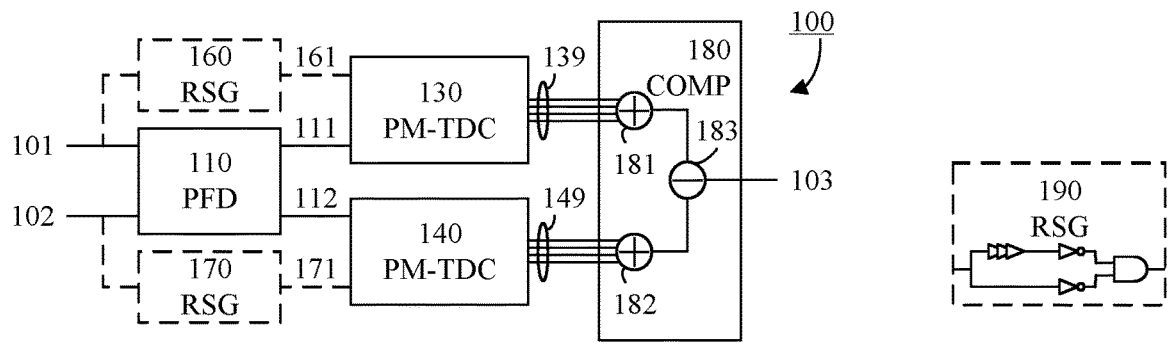
FIG. 1A
FIG. 1B
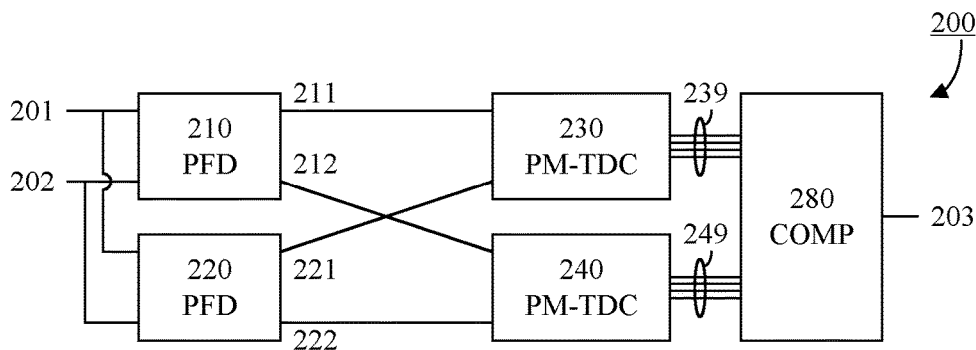
FIG. 2
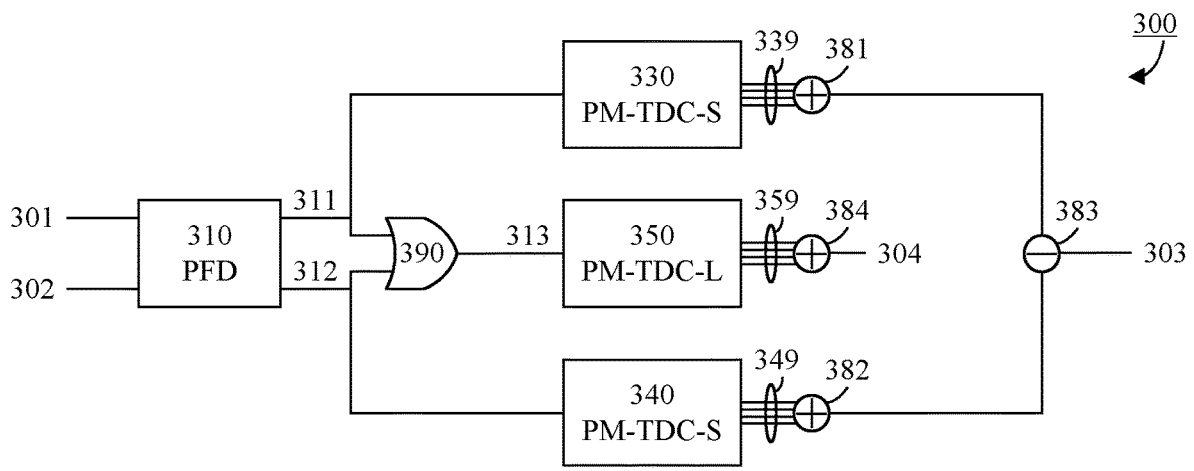
FIG. 3

APPARATUS FOR DIGITAL REPRESENTATION OF ANGULAR DIFFERENCE

TECHNICAL FIELD

The present disclosure relates generally to provision of a digital representation of an angular difference between first and second input signals.

BACKGROUND

There are many scenarios where it is desirable to digitally represent a phase difference between first and second input signals. One example is digital phase-locked loops (DPLLs), wherein an apparatus that converts a phase difference into a digital representation may be a building block.

The in-band phase noise $L_{tdc}$ of a digital phase-locked loop is typically dominated by quantization noise due to limited resolution in a time-to-digital converter TDC of the DPLL. In a typical example, the in-band phase noise may be expressed as $$L_{tdc} = \left(\frac{4\pi^2}{12}\right) \cdot \frac{\Delta t_{inv}^2}{T_{CKV}^2} \cdot \frac{1}{F_{REF}},$$

where $F_{REF}$ is the reference frequency, $T_{CKV}$ is the output signal period of the phase-locked loop, and $\Delta t_{inv}$ is the time resolution of the TDC.

Thus, it is typically desirable to improve (e.g., increase) the resolution of the TDC. However, increased resolution typically entails increased power consumption and/or increased complexity.

Therefore, there is a need for alternative approaches to provision of a digital representation of a phase difference between first and second input signals. Preferably, such approaches facilitate trade-off between resolution, and power consumption and/or complexity.

It should be noted that, even though the background and some embodiments describe use of an apparatus that convert a phase difference into a digital representation in the context of DPLL, this is merely intended as an illustrative and non-limiting example of how such an apparatus may be used.

SUMMARY

It should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to solve or mitigate, alleviate, or eliminate at least some of the above or other disadvantages.

A first aspect is an apparatus for provision of an indication of an angular difference between first and second input signals.

The apparatus comprises a phase frequency detector (PFD) configured to receive the first and second input signals and to provide first and second outputs based on the first and second input signals, wherein a difference in pulse length between signals provided at the first and second outputs is indicative of the phase difference between the first and second input signals.

The apparatus also comprises first and second time-to-digital converters (TDCs), each configured to receive one of the signals provided by the PFD and to provide a corresponding—first and second, respectively—digital pulse length representation.

The apparatus also comprises a comparator configured to provide the indication of the phase difference based on the digital pulse length representations provided by the first and second TDCs.

Each of the TDCs is a pulse length modifying TDC.

In some embodiments, pulse length modification comprises pulse length shrinking or pulse length extension.

In some embodiments, each TDC comprises a plurality of pulse length modifying elements and a plurality of flip-flop elements, the plurality of pulse length modifying elements arranged in sequence to successively modify the pulse length of the received signal, and each flip-flop element providing a respective symbol of the digital pulse length representation based on a correspondingly pulse length modified version of the received signal.

In some embodiments, the PFD comprises first and second flip-flop elements, each configured to provide a respective one of the first and second outputs based on a respective one of the first and second input signals and based on a logical AND-function of the first and second outputs.

In some embodiments, the PFD is a first PFD and the apparatus further comprises a second PFD, wherein the first PFD has a smaller minimum pulse length than the second PFD, and wherein the first and second TDCs are configured receive respective ones of the signals provided by the first PFD and to provide corresponding digital pulse length representations.

In some embodiments, the signals provided by the first PFD are configured to feed respective clock inputs of the first and second TDCs, and the signals provided by the second PFD are configured to reset the first and second TDCs.

In some embodiments, the signals provided by the first PFD are configured to feed respective data inputs of the first and second TDCs, and the signals provided by the second PFD are configured to feed respective clock inputs of the first and second TDCs.

In some embodiments, the received signal of a TDC is configured to feed data inputs of the TDC and a differently pulse length modified version of the received signal is configured to feed clock inputs of the TDC.

In some embodiments, the apparatus further comprises one or more reset signal generators configured to provide corresponding one or more reset signals for the TDCs.

In some embodiments, the apparatus further comprises a third TDC having a longer range than the first and second TDCs. The third TDC is configured to receive a signal representing a logical OR-function of the signals received by the first and second TDCs and to provide a corresponding digital pulse length representation.

In some embodiments, the apparatus is configured to enable the third TDC when the apparatus is operating in a lock acquisition mode and/or to disable the third TDC when the apparatus is operating in a phase-locked mode.

In some embodiments, the comparator is configured to provide a representation of a magnitude of the phase difference based on the digital pulse length representation provided by the third TDC and to provide a representation of a sign of the phase difference based on the digital pulse length representations provided by the first and second TDCs.

In some embodiments, the apparatus comprises TDC circuitry with a plurality of constituent pulse length modifying TDCs, each constituent pulse length modifying TDC configured to—in at least a parallel operation mode of the TDC circuitry—receive a pulse length modified version of one of the signals provided by the PFD with different pulse length modification for at least two of the constituent pulse length modifying TDCs. IN these embodiments, the apparatus is configured to provide each of the first and second digital pulse length representations as a combination of two or more digital pulse length representations provided by the constituent pulse length modifying TDCs.

In some embodiments, the pulse length modifications fulfil one or more of being: stochastically generated, randomly distributed, uniformly distributed, and distributed within a range associated with a constituent pulse length modifying TDC resolution.

In some embodiments, the apparatus is configured to enable the parallel operation mode of the TDC circuitry when the apparatus is operating in a phase-locked mode and/or to enable a serial operation mode of the TDC circuitry when the apparatus is operating in a lock acquisition mode.

A second aspect is time-to-digital converter, TDC, circuitry for converting a pulse length of an input signal to a digitally represented output signal.

The TDC circuitry comprises a plurality of constituent pulse length modifying TDCs, wherein each constituent pulse length modifying TDC is configured to convert a pulse length of a constituent input signal to a digitally represented constituent output signal.

The TDC circuitry also comprises a pulse length modifying circuitry configured to provide the respective constituent inputs signals to each of the constituent pulse length modifying TDCs, wherein each respective constituent input signal comprises a respectively pulse length modified version of the input signal with different respective pulse length modifications for at least two of the respective constituent input signals.

The TDC circuitry also comprises a digital signal combiner configured to provide the digitally represented output signal based on the digitally represented constituent output signals of the constituent pulse length modifying TDCs.

A third aspect is a digital phase-locked loop (DPLL) comprising the apparatus of the first aspect and/or the TDC circuitry of the second aspect.

A fourth aspect is a communication device comprising one or more of: the apparatus of the first aspect, the TDC circuitry of the second aspect, and the DPLL of the third aspect.

In some embodiments, any of the above aspects may additionally have features identical with or corresponding to any of the various features as explained above for any of the other aspects.

An advantage of some embodiments is that alternative approaches are provided for provision of a digital representation of an angular difference between first and second input signals.

An advantage of some embodiments is that resolution is increased compared to prior art approaches.

An advantage of some embodiments is that power consumption is decreased compared to prior art approaches.

An advantage of some embodiments is that complexity is decreased compared to prior art approaches.

An advantage of some embodiments is that trade-off between resolution and power consumption is facilitated.

An advantage of some embodiments is that trade-off between resolution and complexity is facilitated.

An advantage of some embodiments is that the detection range is increased compared to prior art approaches.

An advantage of some embodiments is that robustness is increased compared to prior art approaches.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

FIG. 1A is a schematic block diagram illustrating an example apparatus according to some embodiments;

FIG. 1B is a schematic circuit diagram illustrating example reset circuitry according to some embodiments;

FIG. 2 is a schematic block diagram illustrating an example apparatus according to some embodiments;

FIG. 3 is a schematic block diagram illustrating an example apparatus according to some embodiments;

DETAILED DESCRIPTION

Figure 4:
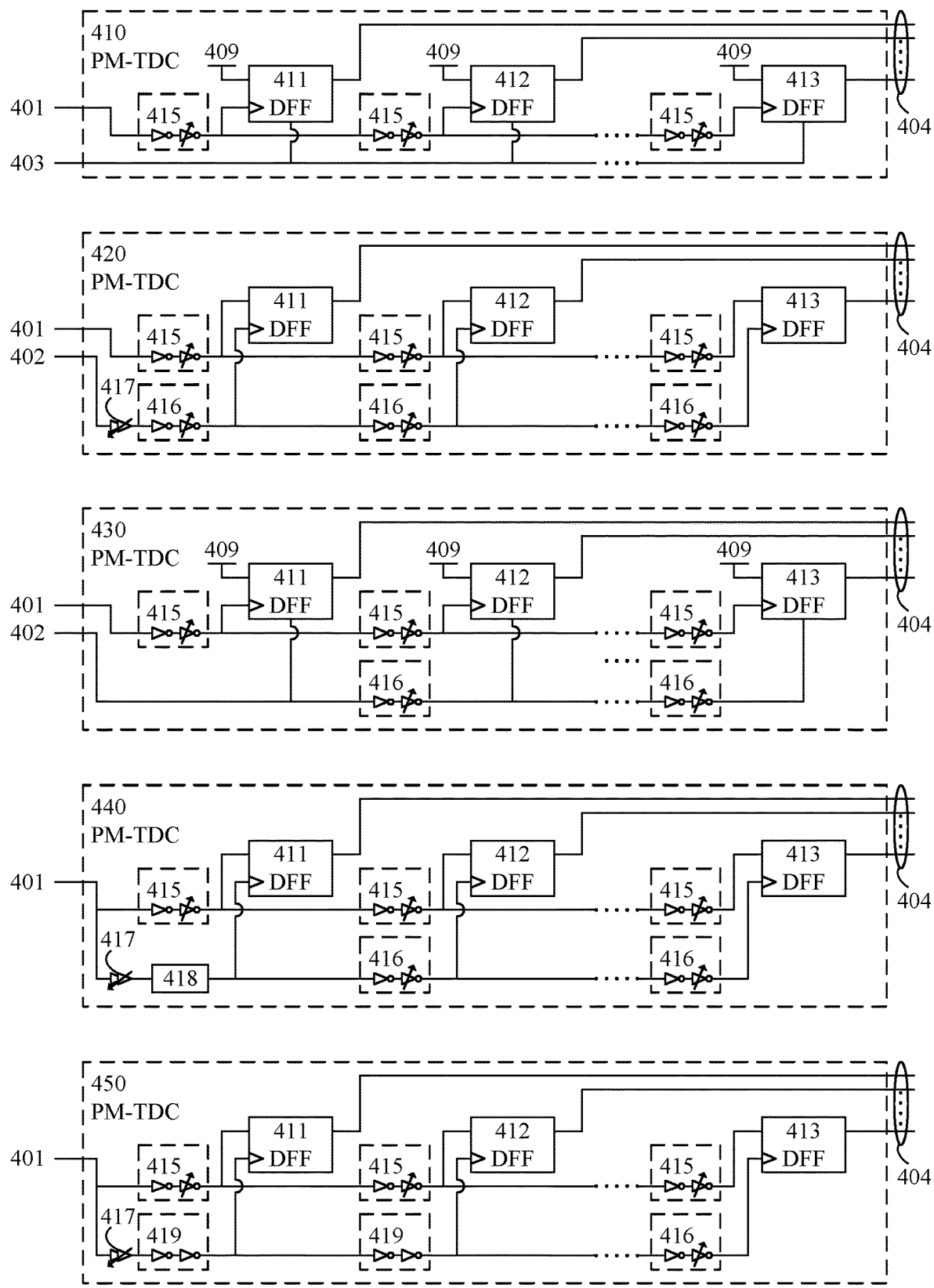
FIG. 4 is a collection of schematic circuit diagrams, each illustrating an example pulse length modifying TDC according to some embodiments.

As already mentioned above, it should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

In the following, embodiments will be described where approaches are provided for provision of a digital representation of an angular difference between first and second input signals.

Some embodiments are based on phase frequency detector(s) and pulse length modifying time-to-digital converters (TDCs). Examples of pulse length modifying TDCs include pulse shrinking TDCs and pulse extending TDCs. Pulse shrinking TDCs will be used as non-limiting exemplification herein.

The term "phase difference" will be used herein to exemplify angular difference. However, it should be noted that embodiments are equally applicable for frequency difference and phase-and-frequency difference.

A pulse shrinking TDC may be based on a chain of stages in similarity to a conventional TDC. However, in a pulse shrinking TDC, the cell corresponding to each stage is typically not a pure delay cell as in a conventional TDC, but a pulse shrinking cell (examples will be shown in connection to FIGS. 4, 6A and 6B). A pulse shrinking cell causes the pulse width of the processed signal to decrease. For example, the pulse width of a received signal processed by a pulse shrinking TDC may decrease by one least significant bit (LSB) for each stage it passes in the chain. Eventually (provided the chain is long enough), the pulse width of the processed signal reaches a threshold value (e.g., zero; in which case there is no pulse in the processed signal for the rest of the chain). The pulse shrinking TDC may output a digital representation of the pulse length of the received signal (e.g., a quantized pulse length; digitally represented). Counting the number of stages that has a pulse provides one indication of the pulse length of the received signal. A flip-flop element may be used for each stage to detect whether or not there is a pulse (e.g., outputting a "1" when there is a pulse and "0" for at least the first stage where there is no pulse).

Generally, the flip-flop element may be any suitable flip-flop element (e.g., a delay flip-flop element, a data flip-flop element, a D flip-flop element, etc.). In the following the notation delay flip-flop element will be used as an example.

Generally, a pulse length modifying TDC is configured to provide a digital representation of the pulse length of a signal input to it (a received signal) by successively modifying the pulse length of the received signal and detect when the pulse length has reached a threshold value.

For example, a pulse shrinking TDC is configured to provide a digital representation of the pulse length of the received signal by successively shrinking the pulse length of the received signal and detect when the pulse length has reached zero (i.e., when the pulse has vanished).

For example, a pulse extending TDC is configured to provide a digital representation of the pulse length of the received signal by successively extending the pulse length of the received signal and detect when the pulse length has reached maximum pulse length (i.e., when the pulse is fully extended in the time range under consideration).

Alternatively or additionally, a pulse extending TDC may be described as configured to provide a digital representation of the pulse length of the received signal by successively shrinking the length of a negative counterpart of the pulse of the received signal—a negative pulse for short—and detect when that length has reached zero (i.e., when the negative pulse has vanished). Thus, pulse shrinking and pulse extending may be seen as the same operation; i.e., shrinking applied to a (positive) pulse in the first case and shrinking applied to a negative pulse in the second case.

Phase frequency detectors and pulse extending TDCs are—conceptually—well known and their general functionality and known implementation variants will not be elaborated on in length herein.

FIG. 1A schematically illustrates an example apparatus 100 according to some embodiments. The apparatus 100 may typically comprise circuitry configured to execute functionality as described herein.

The apparatus 100 is for provision of an indication, 103, of a phase difference between a first input signal 101 and a second input signal 102. For example, the apparatus may be configured to provide the indication 103.

The indication 103 may be any suitable indication such as, for example, a digital representation of the phase difference between the first and second input signals 101, 102, an index representing a phase difference range to which the phase difference between the first and second input signals belongs, or similar.

The first and second input signals 101, 102 may, for example, be a reference signal (REF) and a variable clock signal (CKV). Alternatively or additionally, the first and second input signals 101, 102 may be a reference signal (REF) and a feedback signal (DIV) when the apparatus 100 is used as a component of a digital phase-locked loop (DPLL).

The apparatus 100 comprises a phase frequency detector (PFD) 110. The PFD 110 is configured to receive the first and second input signals 101, 102 and to provide first and second outputs 111, 112 (often termed "UP" and "DOWN", respectively) based on the first and second input signals 101, 102.

A difference in pulse length between signals provided at the first and second outputs 111, 112 is indicative of the phase difference between the first and second input signals 101, 102. Typically, a pulse length difference between the signals provided at the first and second outputs 111, 112 corresponds to (e.g., represents, equals, or similar) the phase difference between the first and second input signals 101, 102. Also typically, which of the signals provided at the first and second outputs 111, 112 has the longer pulse length indicates the sign of the phase difference between the first and second input signals 101, 102.

The apparatus 100 also comprises first and second pulse length modifying time-to-digital converters (PM-TDC) 130, 140. The first PM-TDC 130 is configured to receive the signal 111 provided by the PFD 110 and to provide a corresponding, first, digital pulse length representation 139. The second PM-TDC 140 is configured to receive the signal 112 provided by the PFD and to provide a corresponding, second, digital pulse length representation 149.

As mentioned above, a pulse length modifying TDC may be a pulse extending TDC or a pulse shrinking TDC. Typically, but not necessarily, the first and second PM-TDC 130, 140 are of the same type (pulse shrinking or pulse extending). Also typically, but not necessarily, the first and second PM-TDC 130, 140 are identically implemented.

The apparatus 100 also comprises a comparator (COMP) 180. The comparator 180 is configured to provide the indication 103 of the phase difference based on the digital pulse length representations 139, 149 provided by the first and second PM-TDCs 130, 140.

In a typical example, the comparator 180 is configured to add the non-zero elements of the digital pulse length representations 139, add the non-zero elements of the digital pulse length representations 149, and provide the difference as the indication 103 of the phase difference.

To this end, the comparator 180 may comprise first and second adders 181, 182 and a subtractor 183 as illustrated in FIG. 1A.

Generally, the example of a comparator adding the non-zero elements of a corresponding digital pulse length representation is particularly applicable when the digital pulse length representation consists of binary elements (having values "0" and "1") and all elements of the digital pulse length representation are valid. When the digital pulse length representation does not consist of elements having values "0" and "1", the comparator may count the number of non-zero elements of the digital pulse length representation. When all elements of the digital pulse length representation are not valid, the comparator may consider only non-zero elements up to the first zero element of the digital pulse length representation.

Thus, generally put, the comparator 180 is configured to count the number of valid non-zero elements of the digital pulse length representations 139 (e.g., the number of non-zero elements up to the first zero element), count the number of valid non-zero elements of the digital pulse length representations 149 (e.g., the number of non-zero elements up to the first zero element), and provide the difference as the indication 103 of the phase difference.

To this end, the comparator 180 may comprise first and second counters (compare with the adders 181, 182) and a subtractor 183.

When the first and second PM-TDC 130, 140 are not of the same type (pulse shrinking or pulse extending) and/or are not identically implemented, the comparator may be configured to compensate for the differences between the first and second PM-TDC 130, 140.

Optionally, the apparatus 100 may also comprise first and second reset signal generators (RSG) 160, 170; one associated with each of the first and second PM-TDCs 130, 140. Each RSG 160, 170 is configured to provide a reset signal 161, 171 for the corresponding TDC, based on the corresponding input signal 101, 102. The reset signal 161, 171 is provided to the corresponding TDC and is configured to reset the TDC as required (e.g., at each falling edge of the corresponding signal 101,102 and/or before each pulse of the corresponding the signal 111, 112 provided by the PFD).

FIG. 1B schematically illustrates example circuitry usable as a reset signal generator 190 according to some embodiments. For example, the reset circuitry 190 illustrated in FIG. 1B may be used to implement each of the reset signal generators 160, 170 of FIG. 1A. The reset circuitry 190 of FIG. 1B comprises a logical AND-gate providing the reset signal based on the input signal (possibly inverted) and a delayed version of the input signal (possibly inverted).

FIG. 2 schematically illustrates an example apparatus 200 according to some embodiments. The apparatus 200 may typically comprise circuitry configured to execute functionality as described herein.

The apparatus 200 is for provision of an indication, 203, of a phase difference between a first input signal 201 and a second input signal 202. For example, the apparatus 200 may be configured to provide the indication 203.

The indication 203 may be any suitable indication such as, for example, a digital representation of the phase difference between the first and second input signals 201, 202, an index representing a phase difference range to which the phase difference between the first and second input signals 201, 202 belongs, or similar.

The first and second input signals 201, 202 may, for example, be a reference signal (REF) and a variable clock signal (CKV). Alternatively or additionally, the first and second input signals 201, 202 may be a reference signal (REF) and a feedback signal (DIV) when the apparatus 200 is used as a component of a digital phase-locked loop (DPLL).

The apparatus 200 comprises a first phase frequency detector (PFD) 210 (compare with 110 of FIG. 1A). The first PFD 210 is configured to receive the first and second input signals 201, 202 and to provide first and second outputs 211, 212 (often termed "UP" and "DOWN", respectively) based on the first and second input signals 201, 202. As explained above for the PFD 110 of FIG. 1A, a difference in pulse length between signals provided at the first and second outputs 211, 212 is indicative of the phase difference between the first and second input signals 201, 202.

The apparatus 200 also comprises first and second pulse length modifying time-to-digital converters (PM-TDC) 230, 240 (compare with 130, 140 of FIG. 1A). The first PM-TDC 230 is configured to receive the signal 211 provided by the first PFD and to provide a corresponding, first, digital pulse length representation 239. The second PM-TDC 240 is configured to receive the signal 212 provided by the first PFD and to provide a corresponding, second, digital pulse length representation 249.

As mentioned above, a pulse length modifying TDC may be a pulse extending TDC or a pulse shrinking TDC. Typically, but not necessarily, the first and second PM-TDC 230, 240 are of the same type (pulse shrinking or pulse extending). Also typically, but not necessarily, the first and second PM-TDC 230, 240 are identically implemented.

The apparatus 200 also comprises a comparator (COMP) 280 (compare with 180 of FIG. 1A). The comparator 280 is configured to provide the indication 203 of the phase difference based on the digital pulse length representations 239, 249 provided by the first and second PM-TDCs.

In a typical example, the comparator 280 is configured to count the number of valid non-zero elements of the digital pulse length representations 239, count the number of valid non-zero elements of the digital pulse length representations 249, and provide the difference as the indication 203 of the phase difference, as illustrated in connection to FIG. 1A.

When the first and second PM-TDC 230, 240 are not of the same type (pulse shrinking or pulse extending) and/or are not identically implemented, the comparator 280 may be configured to compensate for the differences between the first and second PM-TDC 230, 240.

The apparatus 200 also comprises a second phase frequency detector (PFD) 220. The second PFD 220 is configured to receive the first and second input signals 201, 202 and to provide first and second outputs 221, 222 (often termed "UP" and "DOWN", respectively) based on the first and second input signals 201, 202.

As explained above, a difference in pulse length between signals provided at the first and second outputs 221, 222 is indicative of the phase difference between the first and second input signals 201, 202.

However, the signals 221, 222 provided by the second PFD 220 are not identical to the signals 211, 212 provided by the first PFD 210.

This is because the first PFD 210 has a smaller minimum pulse length than the second PFD 220. Thus, the shortest pulse length output from the first PFD 210 is shorter than the shortest pulse length output from the second PFD 220. This may, for example, be implemented by including extra delay in the second 220 as will be exemplified in connection with FIGS. 5A and 5B.

Thereby, the signals 221, 222 provided by the second PFD 220 are suitable for flushing the first and second PM-TDCs 230, 240 and/or for being provided to clock inputs of the first and second PM-TDCs 230, 240. It should be noted that the signals 221, 222 provided by the second PFD 220 are not used to reset the first and second PM-TDCs 230, 240 in all embodiments.

The first PM-TDC 230 is configured to receive the signal 221 provided by the second PFD and the second PM-TDC 240 is configured to receive the signal 222 provided by the second PFD. These received signals 221, 222 may be used by the respective PM-TDC for flushing (e.g., by using them to feed a reset input of each flip-flop or by using them to feed a clock input of each flip-flop) as will be exemplified in connection with FIG. 4. Thereby, it may be ensured that each flip-flop of the PM-TDC is ready when data is latched.

Preferably, at least one TDC stage after the pulse has disappeared should be reset/flushed; which provides for latching of a logic "0" after a sequence of logic "1" in the TDC output. Then, the logic "0" can indicate that the pulse has disappeared, and that the subsequent output bits are not valid. The TDC output might have the form "111 . . . 1110xxx . . . xx" (or "000 . . . 0001xxx . . . xx" in the case of pulse extending TDC; "1" indicating that the pulse is fully extended), where x indicates either "0" or "1"; commonly called "don't care". If the long pulse provided by the second PFD resets/flushes two TDC stages after the pulse has disappeared, the TDC output might have the form "111 . . . 1100xxx . . . xx". In this exemplification, the output elements indicated as "0" or "1" may be considered as valid while the output elements indicated as "x" may be considered as not valid.

Optionally, the apparatus 200 may also comprise first and second reset signal generators (not shown); one associated with each of the first and second PM-TDCs 230, 240, as illustrated in connection to FIGS. 1A and 1B. Such reset signal generators may be seen as a complement to flushing by the signals 221, 222.

FIG. 3 schematically illustrates an example apparatus 300 according to some embodiments. The apparatus 300 may typically comprise circuitry configured to execute functionality as described herein.

The apparatus 300 is for provision of an indication 303, 304 of a phase difference between a first input signal 301 and a second input signal 302. For example, the apparatus 300 may be configured to provide the indication 303, 304.

The indication 303, 304 may be any suitable indication such as, for example, a digital representation of the phase difference between the first and second input signals, an index representing a phase difference range to which the phase difference between the first and second input signals belongs, or similar.

The first and second input signals 301, 302 may, for example, be a reference signal (REF) and a variable clock signal (CKV). Alternatively or additionally, the first and second input signals 301, 302 may be a reference signal (REF) and a feedback signal (DIV) when the apparatus 300 is used as a component of a digital phase-locked loop (DPLL).

The apparatus 300 comprises a phase frequency detector (PFD) 310. The PFD 310 is configured to receive the first and second input signals 301, 302 and to provide first and second outputs 311, 312 (often termed "UP" and "DOWN", respectively) based on the first and second input signals. As explained above for the PFD 110 of FIG. 1A, a difference in pulse length between signals provided at the first and second outputs 311, 312 is indicative of the phase difference between the first and second input signals 301, 302.

The apparatus 300 also comprises first and second (short) pulse length modifying time-to-digital converters (PM-TDC-S) 330, 340. The first PM-TDC-S 330 is configured to receive the signal 311 provided by the PFD 310 and to provide a corresponding, first, digital pulse length representation 339. The second PM-TDC-S 340 is configured to receive the signal 312 provided by the PFD 310 and to provide a corresponding, second, digital pulse length representation 349.

As mentioned above, a pulse length modifying TDC may be a pulse extending TDC or a pulse shrinking TDC. Typically, but not necessarily, the first and second PM-TDC-S 330, 340 are of the same type (pulse shrinking or pulse extending). Also typically, but not necessarily, the first and second PM-TDC-S 330, 340 are identically implemented.

The apparatus 300 also comprises a comparator (not explicitly shown in FIG. 3). The comparator is configured to provide a first indication 303 of the phase difference based on the digital pulse length representations 339, 349 provided by the first and second PM-TDC-S.

In FIG. 3, the comparator comprises a first adder 381 configured to add the non-zero elements of the digital pulse length representation 339 (or more generally, a first counter configured to count the number of valid non-zero elements of the digital pulse length representation 339), a second adder 382 configured to add the non-zero elements of the digital pulse length representation 349 (or more generally, a second counter configured to count the number of valid non-zero elements of the digital pulse length representation 349), and a subtractor 383 configured to determine a difference between the results of the adders 381, 382 and provide the difference as the first indication 303 of the phase difference.

When the first and second PM-TDC-S 330, 340 are not of the same type (pulse shrinking or pulse extending) and/or are not identically implemented, the comparator may be configured to compensate for the differences between the first and second PM-TDC-S 330, 340.

The apparatus 300 also comprises a third (long) pulse length modifying time-to-digital converter (PM-TDC-L) 350. At least, the third PM-TDC-L 350 has a longer range (e.g., in terms of detectable pulse lengths) than the first and second PM-TDC-S 330, 340. Typically, the third PM-TDC-L has a substantially longer range than the first and second PM-TDC-S 330, 340 (e.g., by a factor larger than two). Optionally, the third PM-TDC-L 350 may have a lower resolution than the first and second PM-TDC-S 330, 340.

The third PM-TDC-L 350 is configured to receive a signal 313 representing a logical OR-function (e.g., implemented by a logical OR-gate 390) of the signals 311, 312 received by the first and second PM-TDC-S 330, 340. The third PM-TDC-L 350 is configured to provide a corresponding, third, digital pulse length representation 359.

As mentioned above, a pulse length modifying TDC may be a pulse extending TDC or a pulse shrinking TDC. Typically, but not necessarily, the third PM-TDC-L 350 may be of the same type (pulse shrinking or pulse extending) as the first and second PM-TDC-S 330, 340. Also typically, but not necessarily, the third PM-TDC-L 350 may be similarly implemented as the first and second PM-TDC-S 330, 340 (e.g., only differing in one or more of: length, range, and resolution).

The comparator is further configured to provide a second indication 304 of the phase difference based on the digital pulse length representations 359 provided by the third PM-TDC-L.

In FIG. 3, the comparator comprises a third adder 384 configured to add the non-zero elements of the digital pulse length representation 359 to provide a second indication 304 of the phase difference. More generally, the comparator comprises a third counter configured to count the number of valid non-zero elements of the digital pulse length representation 359 to provide the second indication 304 of the phase difference.

The third PM-TDC-L 350 may be better suited than the first and second PM-TDC-S 330, 340 to provide a digital representation of relatively large phase differences between the input signals 301, 302. Alternatively or additionally, the third PM-TDC-L 350 may be worse suited than the first and second PM-TDC-S 330, 340 to provide a digital representation of phase differences between the input signals 301, 302 with high precision. Yet alternatively or additionally, the third PM-TDC-L 350 have higher power consumption than the first and second PM-TDC-S 330, 340.

Therefore, when the apparatus 300 is used as a component of a DPLL, it may be beneficial to use the third PM-TDC-L 350 in a lock acquisition mode of the DPLL and/or to use the first and second PM-TDC-S 330, 340 in a phase-locked mode of the DPLL. Thus, the apparatus 300 may be controllable to enable the third PM-TDC-L (and the OR-gate 390) when the apparatus is operating in a lock acquisition mode (and possibly disable it when the apparatus is operating in a phase-locked mode), with the first and second PM-TDC-S 330, 340 enabled when the apparatus 300 is operating in a phase-locked mode as well as when the apparatus is operating in a lock acquisition mode.

Alternatively or additionally, the first indication 303 of the phase difference may be used for representation of the sign of the phase difference and the second indication 304 of the phase difference may be used for representation of the magnitude of the phase difference.

It should be noted that any functioning combination of features of the apparatuses 100, 200, 300 may also be viewed as an embodiment, even if not explicitly described. For example, the apparatus 300 of FIG. 3 may also comprise reset signal generators (RSG) associated with one or more of the TDCs 330, 340, 350; configured to provide a reset signal for the corresponding TDC, based on the corresponding input signal. Alternatively or additionally, the apparatus 300 of FIG. 3 may also comprise a second PFD (compare with the second PFD 220 of FIG. 2) with different minimum pulse length than the PFD 310 for flushing one or more of the TDCs 330, 340, 350.

Generally, any suitable pulse length modifying TDC(s) may be used in the arrangements 100, 200, 300, or other embodiments. A typical example of a suitable pulse length modifying TDC comprises a plurality of pulse length modifying elements and a plurality of delay flip-flop elements, wherein the plurality of pulse length modifying elements are arranged in sequence to successively modify the pulse length of the received signal, and wherein each delay flip-flop element provides a respective symbol of the digital pulse length representation based on a correspondingly pulse length modified version of the received signal.

FIG. 4 is a collection of examples according to some embodiments; each schematically illustrating a suitable pulse length modifying TDC (PM-TDC; exemplified as pulse shrinking TDCs in the Figure) 410, 420, 430, 440, 450.

The PM-TDC 410 comprises a plurality of pulse length modifying (e.g., pulse shrinking) elements 415 and a plurality of delay flip-flop elements (DFF) 411, 412, 413. The plurality of pulse length modifying elements 415 are arranged in sequence to successively modify the pulse length of the received signal 401.

In some embodiments, each of the pulse length modifying elements 415 may be identical.

The clock input of each DFF 411, 412, 413 is fed a correspondingly pulse length modified version of the received signal 401, and the data input of each DFF 411, 412, 413 is connected to a reference potential 409 (e.g., a power supply; VDD). Each DFF 411, 412, 413 provides a respective symbol of the digital pulse length representation 404 based on the correspondingly pulse length modified version of the received signal 401.

Each DFF 411, 412, 413 is reset as required by a reset signal 403.

The PM-TDC 410 may be particularly suitable for use as the PM-TDCs 130, 140 in the apparatus 100 of FIG. 1A (or any other apparatus using a reset signal generator). When used in the context of the apparatus 100, the received signal 401 may correspond to the signal 111, 112 provided by the PFD 110, the reset signal 403 may correspond to the reset signal 161, 171, and the digital pulse length representation 404 may correspond to the digital pulse length representation 139, 149.

The PM-TDC 420 comprises a plurality of pulse length modifying (e.g., pulse shrinking) elements 415 and a plurality of delay flip-flop elements (DFF) 411, 412, 413. The plurality of pulse length modifying elements 415 are arranged in sequence to successively modify the pulse length of the received signal 401.

The PM-TDC 420 also comprises a plurality of other pulse length modifying (e.g., pulse shrinking) elements 416 arranged in sequence to successively modify the pulse length of another received signal 402. The received signal 402 may pass a delay element 417 before being fed to the plurality of other pulse length modifying elements 416. A purpose of the delay element 417 is to provide enough time for the received signal to settle before latching the signal by a flip-flop, and the delay of the delay element 417 may be set accordingly.

In some embodiments, each of the pulse length modifying elements 415, 416 may be identical.

The clock input of each DFF 411, 412, 413 is fed a correspondingly pulse length modified version of the received signal 402, and the data input of each DFF 411, 412, 413 is fed a correspondingly pulse length modified version of the received signal 401. Each DFF 411, 412, 413 provides a respective symbol of the digital pulse length representation 404 based on the correspondingly pulse length modified version of the received signals 401, 402.

The PM-TDC 420 may be particularly suitable for use as the PM-TDCs 230, 240 in the apparatus 200 of FIG. 2 (or any other apparatus using first and second PFDs with different minimum pulse length). When used in the context of the apparatus 200, the received signal 401 may correspond to the signal 211, 212 provided by the first PFD 210, the received signal 402 may correspond to the signal 221, 222 provided by the second PFD 220, and the digital pulse length representation 404 may correspond to the digital pulse length representation 239, 249. Thus, the signals provided by the first PFD 210 are configured to feed respective data inputs of the first and second TDCs, and the signals provided by the second PFD 220 are configured to feed respective clock inputs of the first and second TDCs.

In this example, there is no need for a reset signal to the DFFs 411, 412, 413. This is because the received signal 402 provided by the second PFD 220 will reach zero length slightly (e.g., one or more DFFs) after the received signal 401 provided by the first PFD 210; causing the DFF chain to be flushed as suitable.

The PM-TDC 430 comprises a plurality of pulse length modifying (e.g., pulse shrinking) elements 415 and a plurality of delay flip-flop elements (DFF) 411, 412, 413. The plurality of pulse length modifying elements 415 are arranged in sequence to successively modify the pulse length of the received signal 401.

The PM-TDC 430 also comprises a plurality of other pulse length modifying (e.g., pulse shrinking) elements 416 arranged in sequence to successively modify the pulse length of another received signal 402. However, the received signal 402 is not pulse length modified in one or more initial stages (exemplified in FIG. 4 in that there is no pulse length modifying element 416 before the first DFF 411).

In some embodiments, each of the pulse length modifying elements 415, 416 may be identical.

The clock input of each DFF 411, 412, 413 is fed a correspondingly pulse length modified version of the received signal 401, and the data input of each DFF 411, 412, 413 is connected to a reference potential 409 (e.g., a power supply; VDD). Each DFF 411, 412, 413 provides a respective symbol of the digital pulse length representation 404 based on the correspondingly pulse length modified version of the received signal 401.

Each DFF 411, 412, 413 is reset as required by a correspondingly pulse length modified version of the received signal 402.

The PM-TDC 430 may be particularly suitable for use as the PM-TDCs 230, 240 in the apparatus 200 of FIG. 2 (or any other apparatus using first and second PFDs with different minimum pulse length). When used in the context of the apparatus 200, the received signal 401 may correspond to the signal 211, 212 provided by the first PFD 210, the received signal 402 may correspond to the signal 221, 222 provided by the second PFD 220, and the digital pulse length representation 404 may correspond to the digital pulse length representation 239, 249. Thus, the signals provided by the first PFD 210 are configured to feed respective clock inputs of the first and second TDCs, and the signals provided by the second PFD 220 are configured to reset the first and second TDCs.

In this example, the signals provided by the second PFD 220 act as reset signals and there is no need for any dedicated reset signal generation circuitry.

The PM-TDC 440 comprises a plurality of pulse length modifying (e.g., pulse shrinking) elements 415 and a plurality of delay flip-flop elements (DFF) 411, 412, 413. The plurality of pulse length modifying elements 415 are arranged in sequence to successively modify the pulse length of the received signal 401.

The PM-TDC 440 also comprises a plurality of other pulse length modifying (e.g., pulse shrinking) elements 416 arranged in sequence to also successively modify the pulse length of the received signal 401. However, there is no pulse length modification corresponding to an element 416 in one or more initial stages (exemplified in FIG. 4 in that there is no pulse length modifying element 416 before the first DFF 411). Instead, this successive pulse length modifying chain commences by a pulse length modification with is contrary to that of an element 416. Thus, when the element 416 is pulse shrinking, the successive pulse length modifying chain commences by a pulse length extension element 418. The received signal 401 may pass a delay element 417 before being fed to the pulse length extension element 418.

In some embodiments, each of the pulse length modifying elements 415, 416 may be identical.

The clock input of each DFF 411, 412, 413 is fed a correspondingly pulse length modified version of the received signal 401 from the successive pulse length modifying chain of elements 416, and the data input of each DFF 411, 412, 413 is fed a correspondingly pulse length modified version of the received signal 401 from the successive pulse length modifying chain of elements 415. Each DFF 411, 412, 413 provides a respective symbol of the digital pulse length representation 404 based on the correspondingly pulse length modified versions of the received signal 401.

The PM-TDC 440 may be particularly suitable for use as the PM-TDCs 130, 140 in the apparatus 100 of FIG. 1A (or any other apparatus not necessarily using a reset signal generator). When used in the context of the apparatus 100, the received signal 401 may correspond to the signal 111, 112 provided by the PFD 110, and the digital pulse length representation 404 may correspond to the digital pulse length representation 139, 149. Thus, the received signal of a TDC is configured to feed data inputs of the TDC and a differently pulse length modified version of the received signal is configured to feed clock inputs of the TDC.

In this example, there is no need for a signal provided by a second PFD (compare with 402 of 420, 430), nor for a reset signal to the DFFs 411, 412, 413. This is because the initially extended version of the received signal 401 will reach zero length slightly (e.g., one or more DFFs) after the received signal 401 fed to the data inputs; causing the DFF chain to be flushed as suitable.

In some embodiments, a PM-TDC is provided that may be seen as a combination of principles of the PM-TDC 430 and the PM-TDC 440. For example, the PM-TDC 430 may be modified by merging the two inputs for the received signals 401, 402 to a single input for a single received signal 401 provided by a PFD 110; possibly with another delay element 417 which the received signal 401 passes before being fed to the first of the delay elements 415.

The PM-TDC 450 comprises a plurality of pulse length modifying (e.g., pulse shrinking) elements 415 and a plurality of delay flip-flop elements (DFF) 411, 412, 413. The plurality of pulse length modifying elements 415 are arranged in sequence to successively modify the pulse length of the received signal 401.

The PM-TDC 450 also comprises a plurality of other pulse length modifying (e.g., pulse shrinking) elements 416 arranged in sequence to also successively modify the pulse length of the received signal 401. However, there is no pulse length modification corresponding to an element 416 in one or more initial stages (exemplified in FIG. 4 in that there is no pulse length modifying element 416 before the first and second DFFs 411, 412; merely delay elements 419). The received signal 401 may pass another delay element 417 before being fed to the first of the delay elements 419.

In some embodiments, each of the pulse length modifying elements 415, 416 may be identical.

The clock input of each DFF 411, 412, 413 is fed a correspondingly pulse length modified version of the received signal 401 from the successive pulse length modifying chain of elements 416, and the data input of each DFF 411, 412, 413 is fed a correspondingly pulse length modified version of the received signal 401 from the successive pulse length modifying chain of elements 415. Each DFF 411, 412, 413 provides a respective symbol of the digital pulse length representation 404 based on the correspondingly pulse length modified versions of the received signal 401.

The PM-TDC 450 may be particularly suitable for use as the PM-TDCs 130, 140 in the apparatus 100 of FIG. 1A (or any other apparatus not necessarily using a reset signal generator). When used in the context of the apparatus 100, the received signal 401 may correspond to the signal 111, 112 provided by the PFD 110, and the digital pulse length representation 404 may correspond to the digital pulse length representation 139, 149. Thus, the received signal of a TDC is configured to feed data inputs of the TDC and a differently pulse length modified version of the received signal is configured to feed clock inputs of the TDC.

In this example, there is no need for a signal provided by a second PFD (compare with 402 of 420, 430), nor for a reset signal to the DFFs 411, 412, 413. This is because the version of the received signal 401 which is not shrunk initially will reach zero length slightly (e.g., one or more DFFs) after the received signal 401 fed to the data inputs; causing the DFF chain to be flushed as suitable.

Figure 5A:
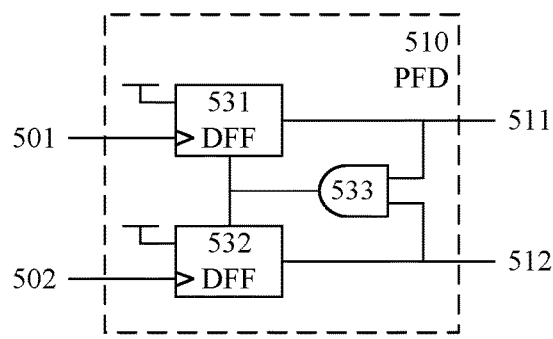
FIG. 5A is a schematic circuit diagram illustrating an example phase frequency detector according to some embodiments.

FIG. 5A schematically illustrates an example phase frequency detector (PFD) 510 according to some embodiments.

The PFD 510 comprises first and second delay flip-flop elements (DFF) 531, 532, and a logical AND-gate 533. Each DFF 531, 532 is configured to provide a respective output 511, 512 based on a respective input signal 501, 502 and based on the output of the AND-gate 533. The AND-gate 533 provides its output based on the respective outputs 511, 512 of the DFFs 531, 532.

The clock input of each DFF 531, 532 is fed the respective input signal 501, 502, and the data input of each DFF 531, 532 is connected to a reference potential (e.g., a power supply; VDD). Each DFF 531, 532 is reset based on the output of the AND-gate 533.

The PFD 510 may be particularly suitable for use as the PFD 110 in the apparatus 100 of FIG. 1A, the PFD 210 in the apparatus 200 of FIG. 2, the PFD 310 in the apparatus 300 of FIG. 3, or the PFD 810 in the apparatus 800 of FIG. 8 (described later herein). When used in any of these contexts, the input signal 501 may correspond to the input signal 101, 201, 301, 801 (respectively), the input signal 502 may correspond to the input signal 102, 202, 302, 802 (respectively), the output 511 may correspond to the output 111, 211, 311, 811 (respectively), and the output 512 may correspond to the output 112, 212, 312, 812 (respectively).

Figure 5B:
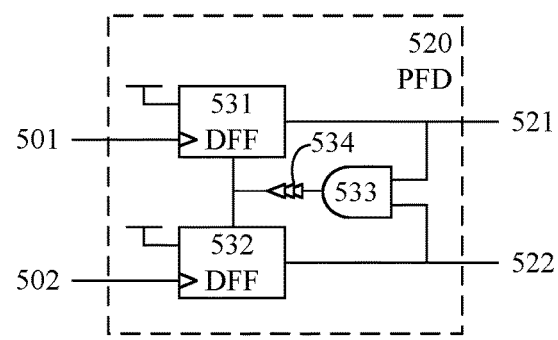
FIG. 5B is a schematic circuit diagram illustrating an example phase frequency detector according to some embodiments.

FIG. 5B schematically illustrates an example phase frequency detector (PFD) 520 according to some embodiments.

The PFD 520 comprises first and second delay flip-flop elements (DFF) 531, 532, and a logical AND-gate 533. Each DFF 531, 532 is configured to provide a respective output 521, 522 based on a respective input signal 501, 502 and based on a delayed version of the output of the AND-gate 533. The AND-gate 533 provides its output based on the respective outputs 521, 522 of the DFFs 531, 532, and the output of the AND-gate 533 is delayed by a delay element 534.

The clock input of each DFF 531, 532 is fed the respective input signal 501, 502, and the data input of each DFF 531, 532 is connected to a reference potential (e.g., a power supply; VDD). Each DFF 531, 532 is reset based on the delayed output of the AND-gate 533.

The delay element 534 renders the PFD 520 to have a longer minimum pulse length than the PFD 510 of FIG. 5A.

When the PFD 510 is used as the PFD 210 in the apparatus 200 of FIG. 2, the PFD 520 may be particularly suitable for use as the PFD 220 in the apparatus 200 of FIG. 2. When used in this context, the input signal 501 may correspond to the input signal 201, the input signal 502 may correspond to the input signal 202, the output 521 may correspond to the output 221, and the output 522 may correspond to the output 222.

Figure 6A:
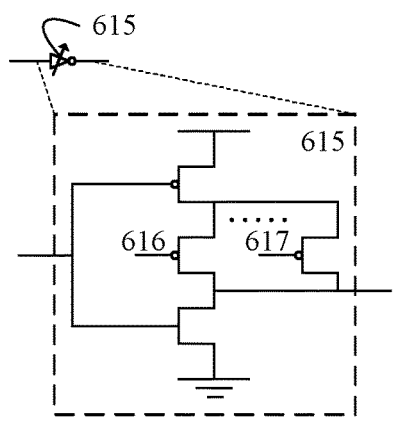
FIG. 6A is a schematic circuit diagram illustrating example pulse shrinking circuitry according to some embodiments.
Figure 6B:
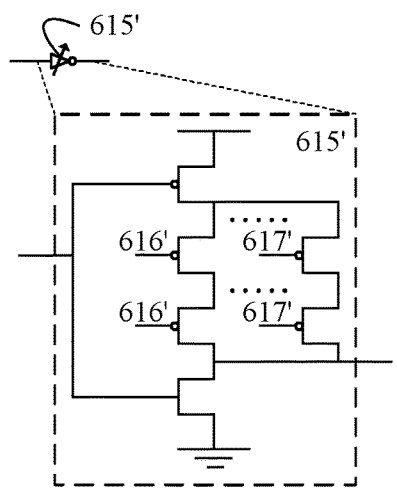
FIG. 6B is a schematic circuit diagram illustrating example pulse shrinking circuitry according to some embodiments.

FIG. 6A illustrates an example pulse shrinking circuitry 615 with tuning signals 616, 617 (e.g., an inverter with tunable rise time), and FIG. 6B illustrates an example pulse shrinking circuitry 615' with tuning signals 616', 617'. The pulse shrinking circuitries 615, 615' may be particularly suitable for use in any of the pulse length modifying (e.g., pulse shrinking) elements 415, 416 of FIG. 4.

In FIG. 6A, the pull up path (i.e., the top p-channel metal-oxide-semiconductor—pMOS—device and the pMOS switches 616, 617) can be made slower by switching on fewer pMOS switches. Consequently, the rise time becomes longer while the pull down path (i.e., the bottom n-channel metal-oxide-semiconductor—nMOS—device) is quite fast. The pulse is therefore shrunk by approximately the increase in rise time.

The functionality of the shrinking circuitry in FIG. 6B is similar to that of FIG. 6A, but switches in series are used be able to increase the range and resolution beyond the minimum allowed device size.

Figure 7:
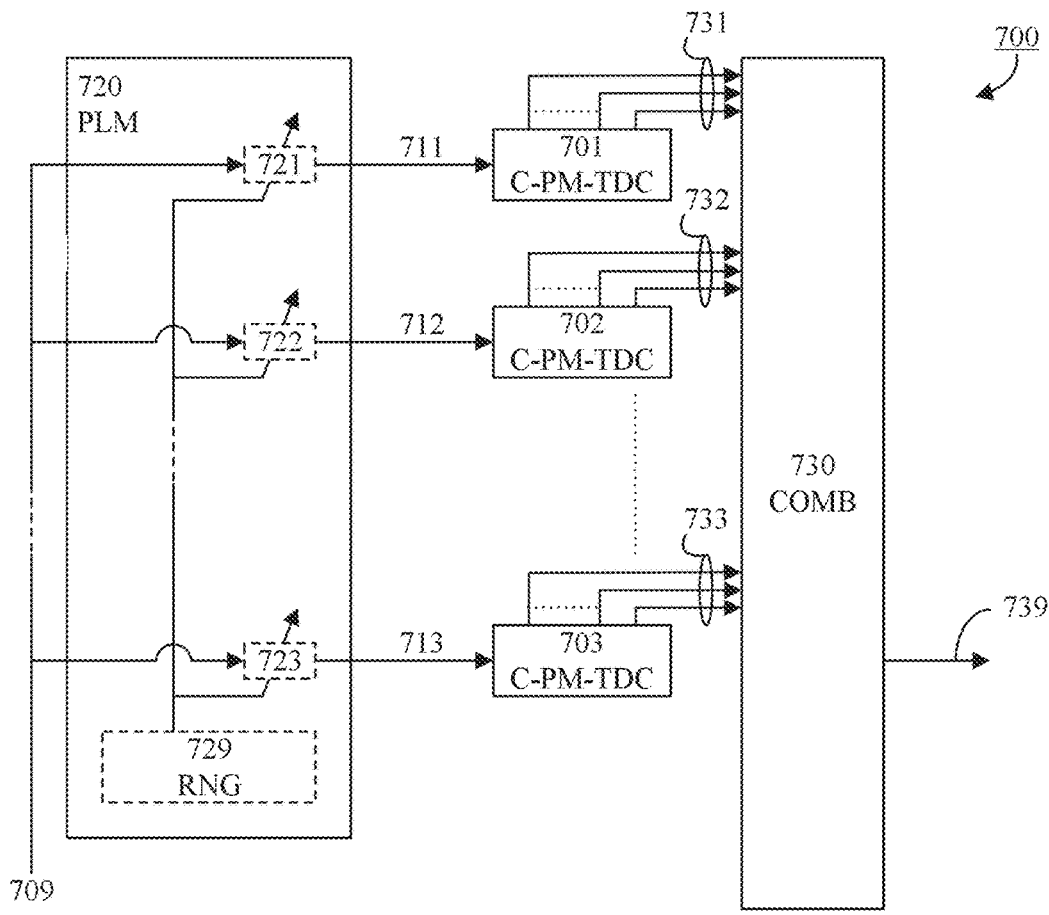
FIG. 7 is a schematic block diagram illustrating example TDC circuitry according to some embodiments.

FIG. 7 schematically illustrates an example (e.g., stochastic) TDC circuitry 700 according to some embodiments. The example TDC circuitry 700 is for converting a pulse length of an input signal 709 to a digitally represented output signal 739.

The TDC circuitry 700 comprises a reference pulse length modifier (PLM) 720, a plurality of constituent TDCs 701, 702, 703, and a digital signal combiner (COMB) 730.

The example TDC circuitry 700 represents a parallel operation mode TDC circuitry, wherein the plurality of constituent TDCs 701, 702, 703 operate in a parallel processing fashion.

The plurality of constituent TDCs is a plurality of constituent pulse length modifying TDCs (C-PM-TDC; e.g., pulse shrinking TDCs or pulse extending TDCs), wherein each constituent pulse length modifying TDC 701, 702, 703 is configured to convert a pulse length of a constituent input signal 711, 712, 713 to a digitally represented constituent output signal 731, 732, 733.

The pulse length modifier 720 is configured to provide respective constituent input signals 711, 712, 713 to each of the constituent TDCs 701, 702, 703. Each of the respective constituent input signals 711, 712, 713 is based on the input signal 709.

The digital signal combiner 730 is configured to provide the digitally represented output signal 739 based on the digitally represented constituent output signals 731, 732, 733 of the constituent TDCs.

In the example TDC circuitry 700, each respective constituent input signal comprises a respectively pulse length modified (e.g., pulse extended) version of the input reference signal 709, with different respective pulse length modifications for at least two of the respective constituent input signals. The pulse modification of the input reference signal 709 may be achieved by the pulse length modifier 720 having pulse length modifying elements 721, 722, 723 providing a respective pulse modification for each of the constituent TDCs 701, 702, 703.

The pulse length modifying elements 721, 722, 723 may be variably controllable as illustrated in FIG. 7. The control may be exercised by a controller (e.g., controlling circuitry or a control module) comprised in, or otherwise associated with (e.g., connectable, or connected, to) the pulse length modifier 720.

In some embodiments, the respective pulse length modifications are stochastically generated and/or randomly distributed. For example, the respective pulse length modifications may be provided according to any suitable random, or pseudo-random, value generation algorithm. The provision of the respective pulse length modifications may be, for example, be implemented by a random number generator (RNG) 729—an exemplification of a controller of the pulse length modifying elements 721, 722, 723.

Whether or not the respective pulse length modifications are stochastically generated and/or randomly distributed, the respective pulse length modifications may be distributed within a range associated with a constituent TDC resolution. For example, the range associated with the constituent TDC resolution may be based on (e.g., equal to, substantially equal to, or slightly exceeding) the (average) pulse length modification of one pulse length modification element of a constituent TDC (compare with 415 of FIG. 4). The range associated with the constituent TDC resolution may be a predetermined range according to some embodiments.

Whether or not the respective pulse length modifications are stochastically generated and/or randomly distributed, the respective pulse length modifications may be uniformly distributed within a distribution range (which may, or may not, be associated with the constituent TDC resolution), according to some embodiments. Non-uniform distributions may be applied in other embodiments.

In the example TDC circuitry 700, the digital signal combiner 730 is configured to provide the digitally represented output signal 739 based on the digitally represented constituent output signals 731, 732, 733 of each of the constituent TDCs.

For example, the digital signal combiner 730 may be configured to (for each of the digitally represented constituent output signals 731, 732, 733) count the number of valid non-zero values of the digitally represented constituent output signal.

Then, the digitally represented output signal 739 may be provided as a digital addition of two or more (typically all, or half) of the counts for the digitally represented constituent output signals 731, 732, 733, as an average value of two or more (typically all, or half) of the counts for the digitally represented constituent output signals 731, 732, 733, or as a median value of two, three, or more (typically all, or half) of the counts for the digitally represented constituent output signals 731, 732, 733.

Each of the constituent TDCs 701, 702, 703 can be implemented according to any suitable PM-TDC approach (e.g., as exemplified in connection with FIG. 4).

In some embodiments, a TDC circuitry similar to that of FIG. 7 is configured for switching between a parallel operation mode (illustrated in FIG. 7) and a serial operation mode. In the serial operation mode, the constituent TDCs 701, 702, 703 are connected in sequence—forming a single (long) TDC—and the combiner 730 provides the digitally represented output signal 739 by counting the number of valid non-zero values in a concatenation of the digitally represented constituent output signals 731, 732, 733.

Figure 8:
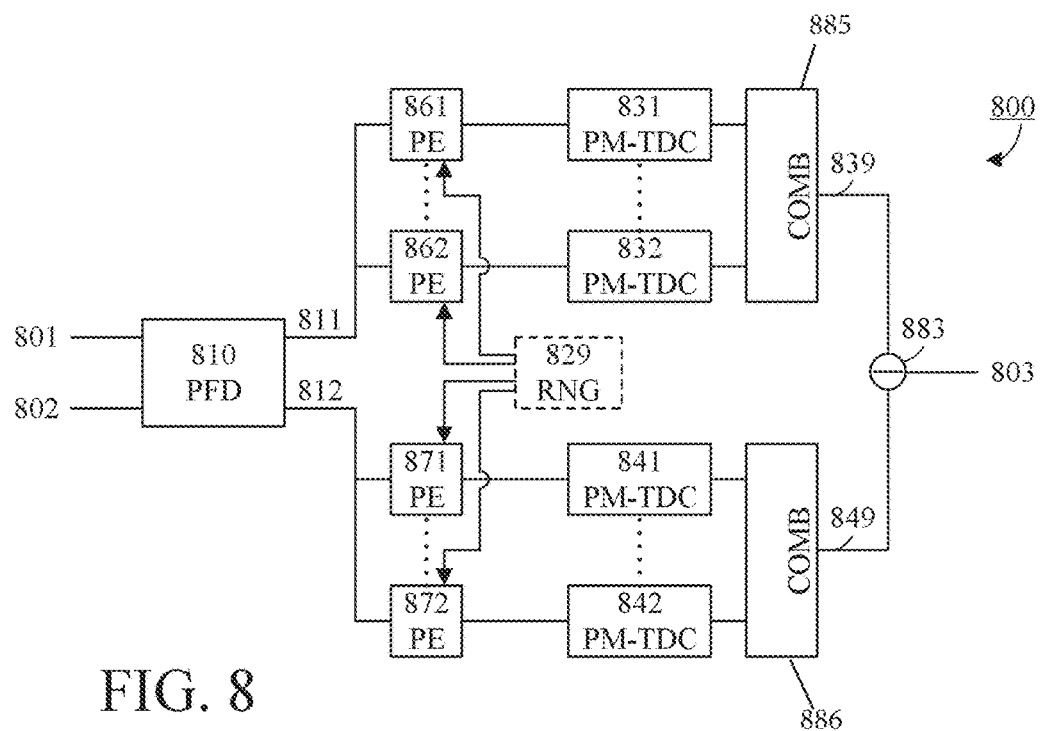
FIG. 8 is a schematic block diagram illustrating an example apparatus using stochastic TDC circuitry according to some embodiments.

FIG. 8 schematically illustrates an example apparatus 800 using stochastic TDC circuitry (e.g., the TDC circuitry 700 of FIG. 7) according to some embodiments. The apparatus 800 may typically comprise circuitry configured to execute functionality as described herein.

The apparatus 800 is for provision of an indication, 803, of a phase difference between a first input signal 801 and a second input signal 802. For example, the apparatus may be configured to provide the indication 803.

The indication 803 may be any suitable indication such as, for example, a digital representation of the phase difference between the first and second input signals 801, 802, an index representing a phase difference range to which the phase difference between the first and second input signals 801, 802 belongs, or similar.

The first and second input signals 801, 802 may, for example, be a reference signal (REF) and a variable clock signal (CKV). Alternatively or additionally, the first and second input signals 801, 802 may be a reference signal (REF) and a feedback signal (DIV) when the apparatus 800 is used as a component of a digital phase-locked loop (DPLL).

The apparatus 800 comprises a phase frequency detector (PFD) 810. The PFD 810 is configured to receive the first and second input signals 801, 802 and to provide first and second outputs 811, 812 (often termed "UP" and "DOWN", respectively) based on the first and second input signals. As explained above for the PFD 110 of FIG. 1A, a difference in pulse length between signals provided at the first and second outputs 811, 812 is indicative of the phase difference between the first and second input signals 801, 802.

The apparatus 800 also comprises first and second groups of pulse length modifying (here exemplified as pulse shrinking) time-to-digital converters (PM-TDC) 8331, 832 and 841, 842, respectively. Each group may correspond to a TDC circuitry such as that of FIG. 7, or the constituent pulse length modifying TDCs of a TDC circuitry such as that of FIG. 7 may be split into two sets—each set representing a group of pulse length modifying time-to-digital converters according to FIG. 8.

Each PM-TDC 831, 832 of the first group is configured to receive a pulse modified (here exemplified as pulse extended) version of the signal 811 provided by the PFD 810 and to provide a corresponding digital pulse length representation. Each PM-TDC 841, 842 of the second group is configured to receive a pulse modified (here exemplified as pulse extended) version of the signal 812 provided by the PFD 810 and to provide a corresponding digital pulse length representation.

The pulse extension may, for example, be provided by a random number generator (RNG) 829 controlling respective pulse extenders (PE; e.g., pulse extending circuitry, or pulse extending elements) 861, 862, 871, 872 (compare with 729 and 721, 722, 723 or FIG. 7).

Thus, in some embodiments, each PM-TDC is preceded by an individual pulse extender. For example, each pulse extender 861, 862, 871, 872 may be a programmable pulse extender. This enables operation of the PM-TDCs in a random, time interleaved, fashion; by extending the pulse length of each PM-TDC input signal by an individual, randomly generated amount. Increasing the number of PM-TDCs may enable one or more of: increasing resolution, improving linearity, and reducing noise.

In some embodiments, random number generator is used to individually control the pulse extension of the input signal to each PM-TDC. Thereby, it is possible to ensure random pulse length interleaving. To save power, the same digital control signal can be applied to two PM-TDCs (one from each of the two groups) according to some embodiments, so that there are pairs of PM-TDCs operating with the same pulse extension. In some embodiments, the pulse extension control range is preferably similar to the pulse shrinking amount per stage in the PM-TDCs. In this way, the stochastic properties and thereby the performance of the apparatus 800 (e.g., in terms of resolution and linearity) can be close to identical over the full TDC range of the apparatus.

The pulse extensions may, for example, be spread uniformly over a range equal to, or slightly exceeding, one LSB of a single PM-TDC.

The first group is configured to provide a first digital pulse length representation 839 (which is a combination of the digital pulse length representations from each of the PM-TDC 831, 832 of the group). The first digital pulse length representation 839 is provided via a combiner, COMB, 885 (compare with 730 of FIG. 7).

The second group is configured to provide a second digital pulse length representation 849 (which is a combination of the digital pulse length representations from each of the PM-TDC 841, 842 of the group). The second digital pulse length representation 849 is provided via a combiner, COMB, 886 (compare with 730 of FIG. 7).

The output for a group may be calculated by combining (e.g., summing, averaging, or taking median of) the counted number of valid non-zero values for all the PM-TDC outputs of the group. Thus, the individual pulse length determination of each PM-TDC may be merged with the other ones such that the effective pulse length determination for a group is collectively determined via all PM-TDCs in a group. The randomization inherent in this technique can provide high linearity, using several parallel PM-TDCs can provide low noise and/or high resolution (due to short average distance to the closest decision point).

As mentioned above, a pulse length modifying TDC may be a pulse extending TDC or a pulse shrinking TDC. Typically, but not necessarily, the PM-TDCs 831, 832, 841, 842 are of the same type (pulse shrinking or pulse extending). Also typically, but not necessarily, the PM-TDCs 831, 832, 841, 842 are identically implemented.

The apparatus 800 also comprises a comparator (represented by a subtractor 883 in FIG. 8; compare with 183 of FIG. 1). The comparator is configured to provide an indication 803 of the phase difference based on the digital pulse length representations 839, 849 provided by the first and second groups of PM-TDCs. In some embodiments, the combiners 885, 886 may be seen as comprised in the comparator.

Thus, the apparatus 800 comprises a PFD 810 and TDC circuitry with a plurality of constituent—pulse length modifying—TDCs 831, 832, 841, 842, wherein each constituent TDC is configured to (in a parallel operation mode of the TDC circuitry) receive a pulse length modified version of one of the signals 811, 812 provided by the PFD with different pulse length modification for at least two of the constituent TDCs. Furthermore, the apparatus 800 is configured to provide each of the first and second digital pulse length representations 839, 849 as explained for 739 in connection with FIG. 7 (parallel operation mode).

In some embodiments, the apparatus 800 is configured to enable the parallel operation mode of the TDC circuitry as illustrated in FIG. 8 when the apparatus is operating in a phase-locked mode (e.g., when the apparatus 800 is used as a component of a DPLL) and enable a serial operation mode of the TDC circuitry when the apparatus is operating in a lock acquisition mode (e.g., when the apparatus 800 is used as a component of a DPLL).

In the serial operation mode, the constituent TDCs of each group (i.e., 831, 832 and 841, 842; respectively) are connected in sequence—forming a single (long) TDC per group—and the respective combiner 885, 886 provides the digitally represented output signal 839, 849 as explained for 739 in connection with FIG. 7 (serial operation mode).

It should be noted that any functioning combination of the apparatus 800 with features of the earlier described apparatuses 100, 200, 300 may also be viewed as an embodiment, even if not explicitly described. For example, the approach with a "third" (longer range) TDC receiving a logical OR-function of the signals provided by the PFD may be combined with the approach illustrated in FIG. 8.

It should also be noted that any suitable feature described in connection to FIG. 8 may be equally relevant for FIG. 7.

Some advantages of an approach such as the one exemplified in FIG. 8 include:

Resolution beyond the gate delay.
Scales well to very high resolution.
Low power consumption, especially in locked state.
Robust and/or fast frequency/phase acquisition.
Very long TDC chains not necessary to achieve high resolution.
Inherent linearity.
Low noise due to parallelization.
Suitable for millimeter wavelength systems (e.g., fifth and sixth generation, 5G, 6G).

Figure 9:
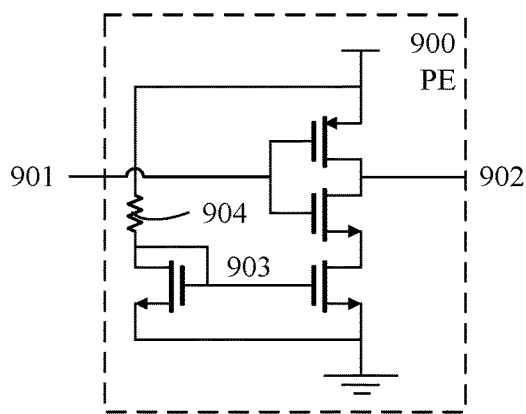
FIG. 9 is a schematic circuit diagram illustrating example pulse extending circuitry according to some embodiments.

FIG. 9 illustrates an example pulse extender (PE) in the form of pulse extending circuitry 900 for a pulse that is active high, with input 901 and output 902, and tuning impedance 904. The pulse extending circuitry 900 may be particularly suitable for use in any of the pulse length modifying (e.g., pulse extending) elements 418 of FIG. 4, 721, 722, 723 of FIG. 7, or 861, 862, 871, 872 of FIG. 8.

For example, the pulse extending circuitry 900 may be an inverter that is current starved on the nMOS-side (by starving the current through the nMOS-transistors, the flank from high to low will become slower). The starved current in FIG. 9 is controllable by an adjustable (e.g., with binary or unitary weighted switched resistor elements) resistor 904 connected to a current mirror. Alternatively, the starved current may be supplied by a current output digital-to-analog converter (DAC), or the bias voltage 903 may be controlled by a voltage output DAC.

Figure 10A:
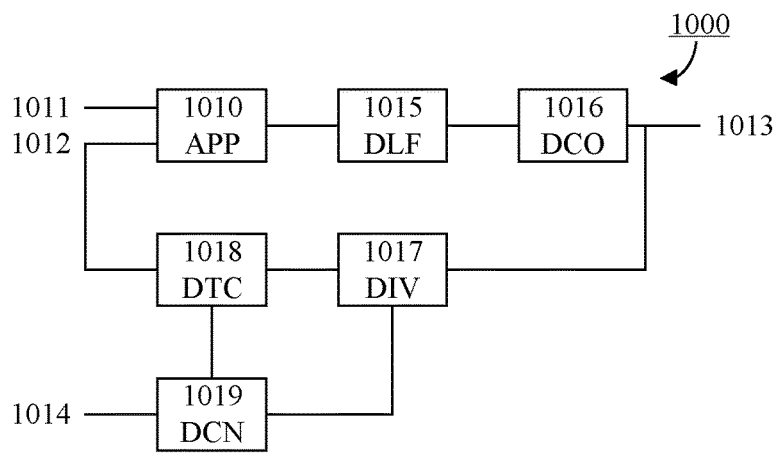
FIG. 10A is a schematic block diagram illustrating an example DPLL according to some embodiments.

FIG. 10A schematically illustrates an example DPLL 1000 according to some embodiments. The DPLL 1000 comprises an apparatus (APP) 1010, which may, for example, be any of the apparatuses 100, 200, 300, 800 described earlier herein. Components of the DPLL 1000—other than the apparatus 1010—are well known in structure and function and will not be elaborated on in detail.

A first input of the apparatus 1010 receives an input signal 1011 (e.g., a reference signal, REF; compare with 101, 201, 301, 801), and the output of the apparatus 1010 (compare with 103, 203, 303, 304, 803) is provided to the input of a digital low pass filter (DLF) 1015 which outputs a control signal provided to a digitally controlled oscillator (DCO) 1016.

The output 1013 of the DCO represents the output of the DPLL 1000, and is also provided to a frequency divider (DIV) 1017 of a feedback loop. The output of the frequency divider 1017 is provided to a digital-to-time converter (DTC) 1018, which is controlled by a digital controller (DCN) 1019 based on a control signal 1014. The DCN 1019 also controls the division ratio of the DIV 1017. The output 1012 of the digital-to-time converter represents a feedback signal (often referred to as "DIV") and is fed to a second input of the apparatus 1010 (compare with 102, 202, 302, 802).

Figure 10B:
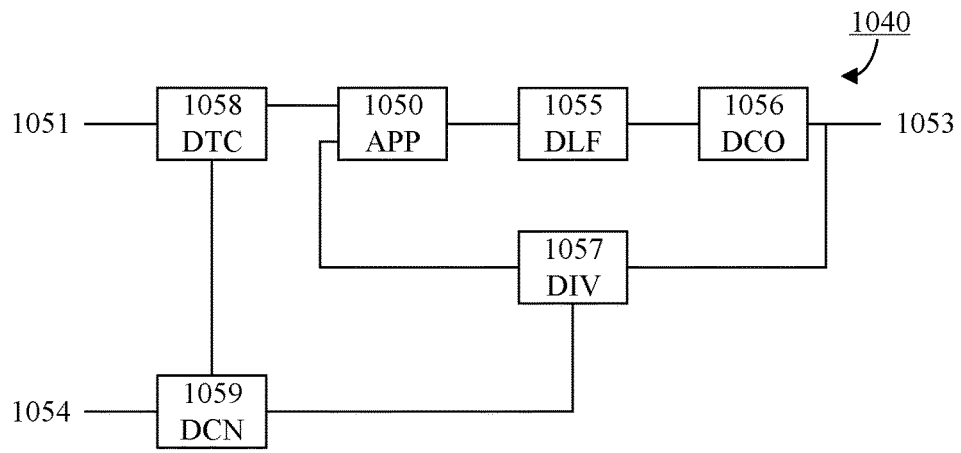
FIG. 10B is a schematic block diagram illustrating an example DPLL according to some embodiments.

FIG. 10B schematically illustrates an example DPLL 1040 according to some embodiments. The DPLL 1040 comprises an apparatus (APP) 1050, which may, for example, be any of the apparatuses 100, 200, 300, 800 described earlier herein. Components of the DPLL 1040—other than the apparatus 1050—are well known in structure and function and will not be elaborated on in detail.

A first input (compare with 101, 201, 301, 801) of the apparatus 1050 receives an input signal provided by a digital-to-time converter (DTC) 1058, which processes a signal 1051 (e.g., a reference signal, REF) and is controlled by a digital controller (DCN) 1059 based on a control signal 1054.

The output of the apparatus 1050 (compare with 103, 203, 303, 304, 803) is provided to the input of a digital low pass filter (DLF) 1055 which outputs a control signal provided to a digitally controlled oscillator (DCO) 1056.

The output 1053 of the DCO represents the output of the DPLL 1040, and is also provided to a frequency divider (DIV) 1057 of a feedback loop. The DCN 1059 also controls the division ratio of the DIV 1057. The output of the frequency divider 1057 represents a feedback signal (often referred to as "DIV") and is fed to a second input of the apparatus 1050 (compare with 102, 202, 302, 802).

Figure 11:
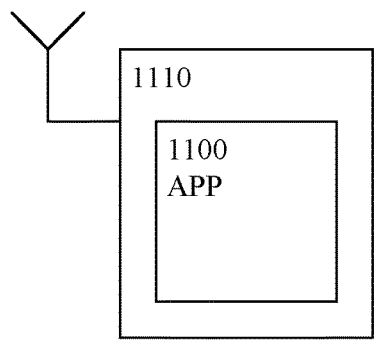
FIG. 11 is a schematic block diagram illustrating an example communication device according to some embodiments.

FIG. 11 schematically illustrates an example communication device 1110 according to some embodiments. The communication device 1110 may, for example, be a transmitter and/or a receiver. Alternatively or additionally, the communication device 1110 may be a user device (e.g., a user equipment, UE, or a station, STA) or a radio access node (e.g., a base station, BS, or an access point, AP).

The communication device 1110 comprises an apparatus (APP) 1100, which may, for example, be any of the apparatuses 100, 200, 300, 800 described earlier herein. For example, the apparatus 1100 may be comprised in the communication device as part of a DPLL.

Some example problems, solutions, and advantages will now be elaborated on to further illustrate various embodiments and their context.

One problem is that many delay line based TDC implemented in advanced Complementary Metal Oxide Semiconductor (CMOS) technologies according to the prior art do not offer high enough resolution to comply with frequency synthesizer noise requirements.

One problem is that increasing the resolution typically requires an increased number of TDC delay elements, which may lead to significant increase in power consumption.

One problem is that improving the accuracy together with increasing resolution may further increase the power consumption.

One problem is that solutions based on Vernier delay lines typically suffer from increased phase noise and/or increased power consumption (due to long delay lines).

One problem is that a typical TDC according to the prior art has full power consumption also during the locked state when it is used as a component of a DPLL.

One problem is that increased complexity (e.g., more complex logic) may be needed in high resolution TDCs to account for various issues; like sequence bubbles.

As indicated before, prior art solutions typically have a trade-off between TDC resolution, linearity, and power consumption. When the required resolution is smaller than the shortest gate delay of the used technology, the trade-off typically gets more severe, since more complex and/or more power consuming architectures may be needed. TDC linearization is also needed to combat PLL spurs. Some embodiment described herein aim to address one or more of these problems; e.g., providing one or more of: improved DPLL performance, increased power efficiency, increased resolution, and improved linearity of the TDC.

Typically, it is desirable that a TDC range covers at least one CKV cycle of a digitally controlled oscillator (DCO) used in a DPLL where the TDC is to be applied. To limit the power consumption of the TDC, it is common in the prior art to limit the TDC range such that it does not exceed (or only slightly exceeds; with some margin for process variation) one CKV cycle of the DCO. A consequence of limiting the TDC range in this way is that the DPLL might need additional approaches to be able to acquire lock. This may, for example, be achieved by adding circuitry forming a frequency-locked loop (FLL). A drawback of such approaches is increased complexity and/or increased power consumption.

In a DPLL of the prior art, a TDC is usually used to perform a phase detection operation. However, the combination of pulse shrinking TDCs and a phase frequency detector (PFD) may be more effective in DPLLs, which is utilized according to some embodiments.

When a DPLL, which uses an apparatus according to some embodiments (e.g., any of 100, 200, 300, 800), is in its locked state—which it may be most of the time—the PFD produces short pulses and only a (typically minor) portion of the pulse shrinking TDCs will be active (i.e., the initial stages until the pulse is no longer present). This may result in decreased power consumption compared to other solutions where the entire TDC chain needs to be active.

Therefore, some embodiments enable relatively high resolution (e.g., increased compared to the prior art; resolution is controlled by the pulse shrinking amount of each TDC stage) as well as relatively low power consumption (e.g., decreased, maintained, or only slightly increased compared to the prior art). For example, it may be possible to provide high resolution phase detection with high reference frequency and low in-band DPLL phase noise; while having low power consumption.

Furthermore, using a PFD in an apparatus according to some embodiments (e.g., any of 100, 200, 300, 800) provides for robust locking acquisition (e.g., when the apparatus is used as a component of a DPLL).

When there is a phase error that is out of range (i.e., too large to be detected by the TDC), this circumstance may be detected in that the TDC output comprises all ones; indicating that the pulse width of the received signal is at least as long as the TDC range.

Thus, some embodiments according to this disclosure use a PFD together with at least two pulse length modifying (e.g., pulse shrinking) TDCs.

For an example of an apparatus where a PFD is combined with pulse-shrinking TDCs, reference is made to FIG. 1A.

When used as a component of a DPLL, a signal coming from the frequency divider (DIV) of the PLL may be fed to one input 101 of the PFD 110 and the reference signal (REF) may be fed to the other input 102 of the PFD 110. In response thereto, the PFD 110 may generate pulses at the UP and DOWN outputs 111, 112; representing the angular (phase and/or frequency) difference between the REF and DIV signals.

During example PFD operation (e.g., in a PLL lock acquisition mode), typically only one of the pulses 111, 112 (UP or DOWN) can be long at the same time. If one pulse is long, the other one may have a predefined minimum length. The minimum length may be controlled by variation of the delay in the reset path of the PFD (compare with 534 of FIG. 5B).

During example PFD operation (e.g., in a PLL locked mode, when the loop filter comprises an integrator so that the phase difference between REF and DIV is forced towards zero), typically both of the pulses 111, 112 (UP and DOWN) have lengths close to the minimum length. After processing by the two TDCs 130, 140, the result of the subtraction 183 is typically close to zero.

As elaborated on above, the PM-TDC 410 of FIG. 4 may be suitable to implement each of the TDCs 130, 140 using the pulse shrinking circuitry 615 of FIG. 6A to implement each of the pulse length modifying elements 415, and the PFD 510 of FIG. 5A may be suitable to implement the PFD 110.

As also elaborated on above, a reset signal generator 160, 170 (e.g., as the one of FIG. 1B) that takes the shrinking pulse width into account may be beneficial. After being reset, the TDCs 130, 140 can again start measuring for pulses on each of the stages of the pulse-shrinking chain. In some implementations, a TDC output bit that is set to "1" will remain so all the time without resetting (since the data input 409 is high, i.e., "1"). Thus, presence/absence of clock signals cannot change the TDC output bit to "0" in such implementations and the reset signal is necessary for adequate function.

Previously described apparatus 200 of FIG. 2 combined with PM-TDC 420 of FIG. 4 provides an example where no resetting at all is needed. Thereby, issues due to current spikes caused by simultaneous reset of all bits may be eliminated. As elaborated on above, the PFD 510 of FIG. 5A may be suitable to implement the first PFD 210, and the PFD 520 of FIG. 5B may be suitable to implement the second PFD 220.

In this example, the signal fed to clock inputs of the TDC DFFs resembles the signal fed to data inputs of the TDC DFFs, but—for each DFF—the signal fed to the clock input is longer than the signal fed to data input. This enables detection of when the pulse has diminished. To avoid meta-stability the CLK signal can be slightly delayed as illustrated by 417 in PM-TDC 420 of FIG. 4.

Previously described apparatus 200 of FIG. 2 combined with PM-TDC 430 of FIG. 4 provides an example where no specific reset signal is needed. Instead, flushing is provided using the signal output from the second PFD 220; thereby providing "resetting" of the TDC stage by stage in time. As elaborated on above, the PFD 510 of FIG. 5A may be suitable to implement the first PFD 210, and the PFD 520 of FIG. 5B may be suitable to implement the second PFD 220.

Compared to a conventional pulse shrinking TDC, some stages of the proposed PM-TDCs 420, 430 detect also when the pulse length of the received signal 401 has diminished (i.e., when the output bit is "0"), which eliminates any need for a global reset functionality.

To generate the signal 402 with longer pulse, an auxiliary (second) PFD 220 may be used as exemplified by FIGS. 2 and 5B. Using the signals output from the second PFD as illustrated for the PM-TDCs 420 and 430, it may be ensured that each DFF is flushed before data is latched.

As mentioned before, it may be preferable that at least one TDC stage after the pulse has disappeared is reset/flushed; which provides for latching of a logic "0" after a sequence of logic "1" in the TDC output. Then, the logic "0" can indicate that the pulse has disappeared, and that the subsequent output bits are not valid. The TDC output might have the form "111 . . . 1110xxx . . . xx" (or "000 . . . 0001xxx . . . xx" in the case of pulse extending TDC; "1" indicating that the pulse is fully extended), where x indicates either "0" or "1"; commonly called "don't care". If the long pulse 402 resets/flushes two TDC stages after the pulse has disappeared, the TDC output might have the form "111 . . . 1100xxx . . . xx".

One advantage that makes some embodiments attractive is that the phase difference can be simply calculated as the position of the first logic "0" in the output sequence. Thus, an alternative to the summation of the number of "1" in the TDC output (e.g., implemented by adders 181, 182) is to find the first logic "0" in the output sequence. If summation of the number of "1" is applied, a TDC output of the form "111 . . . 110xxx . . . xx" (or more generally "111 . . . 110 . . . 0xxx . . . xx") may be interpreted as "111 . . . 110000 . . . 00" before summation.

An alternative to using a second PFD 220 to eliminate the need for a specific reset signal is provided by previously described apparatus 100 of FIG. 1 (for example) combined with any of the PM-TDCs 440, 450 of FIG. 4. As elaborated on before, the PM-TDCs 440, 450 provide a similar function as the PM-TDC 420, but without the need of the input signal 402 with longer pulse length. To resemble the function of the input signal 402, PM-TDC 440 uses a pulse extending circuit for the clock input processing path of the input signal 401, as illustrated by 418 in FIG. 4. To resemble the function of the input signal 402, PM-TDC 450 lets the first one or more stages be without pulse shrinking for the clock input processing path of the input signal 401, as illustrated by 419 in FIG. 4.

The described embodiments and their equivalents may be realized in hardware; possibly combined with control circuitry configured to execute software realizing one or more features. The embodiments may be performed by general purpose circuitry, such as programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a communication device.

Embodiments may appear within an electronic apparatus (such as a communication device) comprising arrangements, circuitry, and/or logic according to any of the embodiments described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A communication device comprising an apparatus for provision of an indication of an angular difference between first and second input signals, the apparatus comprising:
   a phase frequency detector (PFD) configured to receive the first and second input signals and to provide first and second outputs based on the first and second input signals, wherein a difference in pulse length between signals provided at the first and second outputs is indicative of the phase difference between the first and second input signals;
   first and second time-to-digital converters (TDCs), each configured to receive one of the signals provided by the PFD and to provide a corresponding—first and second, respectively—digital pulse length representation, wherein each of the TDCs is a pulse length modifying TDC; and
   a comparator configured to provide the indication of the angular difference based on the digital pulse length representations respectively provided by the first and second TDCs;
   wherein the PFD is a first PFD and the apparatus further comprises a second PFD, the first PFD having a smaller minimum pulse length than the second PFD, and wherein the first and second TDCs are configured to receive respective ones of the signals provided by the first PFD and to provide corresponding digital pulse length representations.

2. The communication device of claim 1, wherein the communication device comprises a digital phase-locked loop, DPLL, wherein the DPLL comprises the apparatus.

3. The communication device of claim 1, wherein pulse length modification comprises pulse length shrinking or pulse length extension.

4. The communication device of claim 1, wherein each of the first and second TDCs comprises a plurality of pulse length modifying elements and a plurality of flip-flop elements, the plurality of pulse length modifying elements arranged in sequence to successively modify a pulse length of the signal received by the TDC, and each flip-flop element providing a respective symbol of the digital pulse length representation provided by the TDC based on a correspondingly pulse length modified version of the received signal.

5. The communication device of claim 1, wherein the first PFD comprises first and second flip-flop elements, each configured to provide a respective one of the first and second outputs based on a respective one of the first and second input signals and based on a logical AND-function of the first and second outputs.

6. The communication device of claim 1, wherein the received signal of a TDC is configured to feed data inputs of the TDC and a differently pulse length modified version of the received signal is configured to feed clock inputs of the TDC.

7. The communication device of claim 1, wherein the apparatus further comprises one or more reset signal generators configured to provide corresponding one or more reset signals for the TDCs.

8. The communication device of claim 1, wherein the signals provided by the first PFD are configured to feed respective clock inputs of the first and second TDCs, and wherein the signals provided by the second PFD are configured to feed respective reset inputs of the first and second TDCs.

9. The communication device of claim 1, wherein the signals provided by the first PFD are configured to feed respective data inputs of the first and second TDCs, and wherein the signals provided by the second PFD are configured to feed respective clock inputs of the first and second TDCs.

10. A communication device comprising an apparatus for provision of an indication of an angular difference between first and second input signals, the apparatus comprising:
    a phase frequency detector (PFD) configured to receive the first and second input signals and to provide first and second outputs based on the first and second input signals, wherein a difference in pulse length between signals provided at the first and second outputs is indicative of the phase difference between the first and second input signals;
    first and second time-to-digital converters (TDCs), each configured to receive one of the signals provided by the PFD and to provide a corresponding-first and second, respectively-digital pulse length representation, wherein each of the TDCs is a pulse length modifying TDC;
    a comparator configured to provide the indication of the angular difference based on the digital pulse length representations respectively provided by the first and second TDCs; and
    a third TDC having a longer range than the first and second TDCs, and configured to receive a signal representing a logical OR-function of the signals received by the first and second TDCs and to provide a corresponding digital pulse length representation.

11. The communication device of claim 10, wherein the communication device comprises a digital phase-locked loop, DPLL, wherein the DPLL comprises the apparatus.

12. The communication device of claim 10, wherein pulse length modification comprises pulse length shrinking or pulse length extension.

13. The communication device of claim 10, wherein each of the first and second TDCs comprises a plurality of pulse length modifying elements and a plurality of flip-flop elements, the plurality of pulse length modifying elements arranged in sequence to successively modify a pulse length of the signal received by the TDC, and each flip-flop element providing a respective symbol of the digital pulse length representation provided by the TDC based on a correspondingly pulse length modified version of the received signal.

14. The communication device of claim 10, wherein the PFD comprises first and second flip-flop elements, each configured to provide a respective one of the first and second outputs based on a respective one of the first and second input signals and based on a logical AND-function of the first and second outputs.

15. The communication device of claim 10, wherein the received signal of a TDC is configured to feed data inputs of the TDC and a differently pulse length modified version of the received signal is configured to feed clock inputs of the TDC.

16. The communication device of claim 10, wherein the apparatus further comprises one or more reset signal generators configured to provide corresponding one or more reset signals for the TDCs.

17. The communication device of claim 16, wherein the apparatus is configured to enable the third TDC when the apparatus is operating in a lock acquisition mode and/or to disable the third TDC when the apparatus is operating in a phase-locked mode.

18. The communication device of claim 16, wherein the comparator is configured to provide a representation of a magnitude of the angular difference based on the digital pulse length representation provided by the third TDC and to provide a representation of a sign of the angular difference based on the digital pulse length representations provided by the first and second TDCs.

19. A communication device comprising an apparatus for provision of an indication of an angular difference between first and second input signals, the apparatus comprising:
- a phase frequency detector (PFD) configured to receive the first and second input signals and to provide first and second outputs based on the first and second input signals, wherein a difference in pulse length between signals provided at the first and second outputs is indicative of the phase difference between the first and second input signals;
- first and second time-to-digital converters (TDCs), each configured to receive one of the signals provided by the PFD and to provide a corresponding—first and second, respectively—digital pulse length representation, wherein each of the TDCs is a pulse length modifying TDC;
- a comparator configured to provide the indication of the angular difference based on the digital pulse length representations respectively provided by the first and second TDCs; and
- TDC circuitry with a plurality of constituent pulse length modifying TDCs, each constituent pulse length modifying TDC configured to—in at least a parallel operation mode of the TDC circuitry—receive a pulse length modified version of one of the signals provided by the PFD with different pulse length modification for at least two of the constituent pulse length modifying TDCs, the apparatus configured to provide each of the first and second digital pulse length representations as a combination of two or more digital pulse length representations provided by the constituent pulse length modifying TDCs.

20. The communication device of claim 19, wherein the communication device comprises a digital phase-locked loop, DPLL, wherein the DPLL comprises the apparatus.

21. The communication device of claim 19, wherein pulse length modification comprises pulse length shrinking or pulse length extension.

22. The communication device of claim 19, wherein each of the first and second TDCs comprises a plurality of pulse length modifying elements and a plurality of flip-flop elements, the plurality of pulse length modifying elements arranged in sequence to successively modify a pulse length of the signal received by the TDC, and each flip-flop element providing a respective symbol of the digital pulse length representation provided by the TDC based on a correspondingly pulse length modified version of the received signal.

23. The communication device of claim 19, wherein the PFD comprises first and second flip-flop elements, each configured to provide a respective one of the first and second outputs based on a respective one of the first and second input signals and based on a logical AND-function of the first and second outputs.

24. The communication device of claim 19, wherein the received signal of a TDC is configured to feed data inputs of the TDC and a differently pulse length modified version of the received signal is configured to feed clock inputs of the TDC.

25. The communication device of claim 19, wherein the apparatus further comprises one or more reset signal generators configured to provide corresponding one or more reset signals for the TDCs.

26. The communication device of claim 19, wherein the pulse length modifications fulfill one or more of being: stochastically generated, randomly distributed, uniformly distributed, and distributed within a range associated with a constituent pulse length modifying TDC resolution.

27. The communication device of claim 19, wherein the apparatus is configured to enable the parallel operation mode of the TDC circuitry when the apparatus is operating in a phase-locked mode and/or to enable a serial operation mode of the TDC circuitry when the apparatus is operating in a lock acquisition mode.

* * * * *